United States Patent [19]
Matz

[11] Patent Number: 5,491,454
[45] Date of Patent: Feb. 13, 1996

[54] METHOD AND APPARATUS FOR REDUCING DISTORTION IN AN OUTPUT SIGNAL OF AN AMPLIFIER

[75] Inventor: John E. Matz, Hanover Park, Ill.

[73] Assignee: Motorola, Inc., Schaumburg, Ill.

[21] Appl. No.: 332,163

[22] Filed: Oct. 31, 1994

[51] Int. Cl.$^6$ ....................................................... H03F 1/26
[52] U.S. Cl. .......................................... 330/149; 330/151
[58] Field of Search ............................ 330/52, 149, 151; 332/159, 160, 161, 162

[56] References Cited

U.S. PATENT DOCUMENTS

| | | | |
|---|---|---|---|
| 4,885,551 | 12/1989 | Myer | 330/52 |
| 5,077,532 | 12/1991 | Obermann et al. | 330/151 |
| 5,130,663 | 7/1992 | Tattersall, Jr. | 330/52 |
| 5,307,022 | 4/1994 | Tattersall, Jr. et al. | 330/52 |
| 5,386,198 | 1/1995 | Ripstrand et al. | 330/151 X |

OTHER PUBLICATIONS

H. Seidel, "A Feed–Forward Experiment", The Bell System Technical Journal, vol. 50, No. 9, Nov. 1971, pp. 2879–2916.

*Primary Examiner*—Steven Mottola
*Attorney, Agent, or Firm*—Daniel C. Crilly; Jeffrey G. Toler

[57] ABSTRACT

A feed forward amplifier network (100) employs a method (300) and apparatus for reducing distortion contained in an output signal (142) of an amplifier circuit (101). A modulator (118, 120) modulates (303) an input signal (141) of the amplifier circuit (101) with a reference modulation. The amplifier circuit (101) amplifies (305) the modulated signal, introducing nonlinear distortion in the process. A modulation determination circuit (107, 109, 115) determines (307) the reference modulation in the amplified signal and provides the determined modulation to an adjustment circuit (105). The adjustment circuit (131,133, 135) adjusts (309) a characteristic of the determined modulation in response to a control signal (153,155) and combines (137, 311) the adjusted modulation with the amplified signal (142) at the output of the amplifier circuit (101) to produce a corrected signal (151). A residual modulation detection circuit (139, 125, 127, 129) demodulates (313) the corrected signal (151) to recover any residual modulation remaining in the corrected signal (151) and adjusts (317) the control signal (153, 155) to reduce the recovered residual modulation.

27 Claims, 2 Drawing Sheets

5,491,454

METHOD AND APPARATUS FOR REDUCING DISTORTION IN AN OUTPUT SIGNAL OF AN AMPLIFIER

FIELD OF THE INVENTION

The present invention relates generally to power amplifier circuits and, in particular, to reducing nonlinear distortion contained in an output signal of a power amplifier circuit.

BACKGROUND OF THE INVENTION

Radio frequency (RF) power amplifiers, such as class AB, bipolar junction transistor (BJT) amplifiers, are known to introduce amplitude and phase distortion in an amplified output signal due to the inherent nonlinear characteristics of BJT devices. Such distortion typically includes high order nonlinearities (e.g., fifth order, seventh order, and ninth order intermodulation products) when the BJT device is driven with multiple tone, high voltage input signals, as is the case for base station amplifiers at a typical cellular base site. When transmitted, the distortion creates unwanted interference in the transmission bandwidth of the cellular system—for example, at the frequencies corresponding to the fifth order, seventh order, and ninth order intermodulation products.

To reduce the nonlinear distortion produced by high power RF amplifiers, amplifier designers generally use a linearization technique, such as a feed forward technique. In one feed forward realization, an input signal to an RF amplifier is sampled prior to amplification by the RF amplifier. An RF pilot reference signal is combined with the input signal subsequent to the sampling of the input signal. The input signal and the RF pilot signal are applied to the RF amplifier. The RF amplifier amplifies both signals and introduces nonlinear amplitude and phase distortion into both signals during the amplification process. The amplified signal is sampled and the sampled input signal is subtracted from the sampled amplified signal to extract the distortion in the sampled amplified signal. This extracted distortion is commonly called an error signal.

The error signal is adjusted in amplitude and phase based on the level of the RF pilot signal detected with an RF pilot receiver at the output of the feed forward amplifier network. The adjusted error signal is amplified and subtracted from the originally amplified signal to produce a corrected signal having less distortion than the originally amplified signal. The corrected signal serves as the output signal of the feed forward network. Thus, the feed forward approach reduces the distortion introduced by the high power RF amplifier circuit as indicated by a reduction in the level of the RF pilot signal in the output signal.

The RF pilot signal is used to monitor the level of nonlinear distortion contained in the corrected signal. However, complex and costly RF circuitry (e.g., an RF oscillator, an RF amplifier, and an RF receiver) is required to generate and receive the RF pilot signal. Therefore, a need exists for a method and apparatus for reducing distortion in an output signal of an amplifier circuit that does not use an RF pilot signal as a reference for monitoring the distortion in a feed forward configuration.

DESCRIPTION OF A PREFERRED EMBODIMENT

Generally, the present invention encompasses a method and apparatus for reducing distortion contained in an output signal of an amplifier circuit. A modulator modulates an input signal of the amplifier circuit with a reference modulation. The amplifier amplifies the modulated signal, introducing nonlinear distortion during the amplification process. A modulation determination circuit determines the reference modulation in the amplified signal and provides the determined modulation to an adjustment circuit. The adjustment circuit adjusts a characteristic of the determined modulation in response to a control signal and combines the adjusted modulation with the amplified signal to produce a corrected signal. A residual modulation detection circuit demodulates the corrected signal to recover any residual modulation remaining in the corrected signal and adjusts the control signal to reduce the recovered residual modulation. Since the amount of residual modulation remaining in the output signal of the amplifier circuit correlates directly with the amount of nonlinear distortion present in the output signal of the reduces the nonlinear distortion. By reducing the distortion in the amplifier circuit's output signal in this manner, the present invention obviates the need for combining a reference RF pilot signal with the amplifier circuit's input signal by applying a low frequency reference modulation to the amplifier circuit's input signal. Such a modification in references reduces the cost and complexity of the feed forward amplifier network by replacing costly RF amplifiers and receivers with cost-effective, low frequency analog elements.

Figure 1:
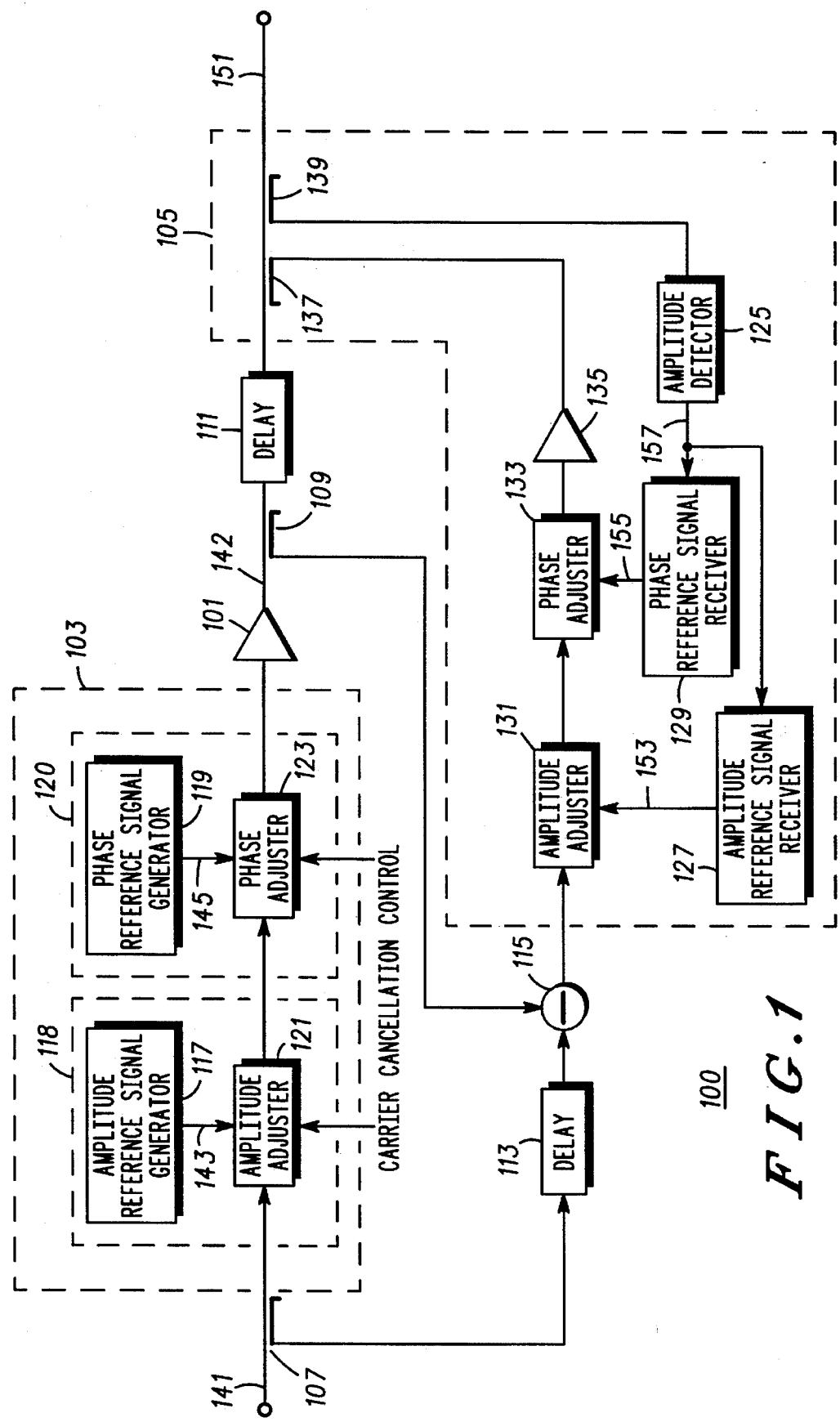
FIG. 1 illustrates a feed forward amplifier network in accordance with a preferred embodiment of the present invention.

The present invention can be more fully described with reference to FIGS. 1–3. FIG. 1 illustrates a feed forward amplifier network 100 in accordance with a preferred embodiment of the present invention. The feed forward amplifier network 100 comprises an amplifier circuit 101, means for modulating 103 an input signal 141 of the amplifier circuit 101 with a reference modulation, means for reducing 105 any residual reference modulation in an output signal 142 of the amplifier circuit 101, an input coupler 107, an amplifier output coupler 109, two delay devices 111, 113, and a combining network 115. The amplifier circuit 101 preferably comprises a class AB, BJT RF power device along with any necessary DC biasing and RF matching circuitry. The couplers 107, 109 preferably comprise microstrip or stripline directional couplers. The delay devices 111, 113 preferably comprise predetermined length transmission lines, such as coaxial cables, that introduce desired time delays into their respective signal paths. The combining network 115 preferably comprises a one-half wavelength transmission line and a directional coupler that together invert and attenuate the signal provided by the amplifier output coupler 109. The means for modulating 103 and the means for reducing 105 are discussed in detail below.

In the preferred embodiment, the means for modulating 103 comprises two low frequency modulators 118, 120, each modulator 118, 120 including a reference signal generator 117, 119 and an input signal characteristic adjuster 121, 123. The first modulator 118 modulates the amplitude of the input signal 141, while the second modulator 120 modulates the phase of the input signal 141. In an alternate embodiment, the means for modulating 103 might comprise a quadrature amplitude modulator. Although the following discussion describes modulation of both the amplitude and phase of the input signal 141, the discussion is also applicable when the means for modulating 103 includes only one modulator (e.g., 118 or 120) that modulates either the amplitude or phase of the input signal 141.

The amplitude reference signal generator 117 preferably comprises a tone generator that produces a 13 KHz reference amplitude modulation (AM) signal 143, while the phase reference signal generator 119 preferably comprises a tone generator that produces an 11 KHz reference phase modulation (PM) signal 145. In an alternate embodiment, the reference signal generators 117, 119 might comprise pseudo-noise (PN) sequence generators that produce digital modulation signals corresponding to orthogonal PN sequences. In yet another embodiment, the reference signal generators 117, 119 might be incorporated into the carrier cancellation control commonly used in a feed forward amplifier network 100. The amplitude adjuster 121 preferably comprises a voltage variable attenuator responsive to the reference AM signal 143. Similarly, the phase adjuster 123 preferably comprises a known voltage variable phase adjusting circuit (e.g., a circulator and a varactor diode) responsive to the reference PM signal 145.

The means for reducing 105 preferably comprises an amplitude detector 125, an amplitude reference signal receiver 127, a phase reference signal receiver 129, an amplitude adjuster 131, a phase adjuster 133, an error amplifier 135, and a pair of couplers 137, 139. The amplitude detector 125 comprises a well-known envelope detector. The amplitude and phase adjusters 131,133 are comparable to the input signal amplitude and phase adjusters 121, 123. The error amplifier 135 is similar to the amplifier circuit 101; however, the output power of the error amplifier 135 is considerably less than the output power of the amplifier circuit 101. The couplers 137, 139 preferably comprise microstrip or stripline directional couplers. A preferred embodiment of the reference signal receivers 127, 129 is detailed below with regard to FIG. 2.

Operation of the feed forward amplifier network 100 occurs in the following manner in accordance with a preferred embodiment of the present invention. The input signal 141 to the feed forward network 100 is provided to the input signal amplitude adjuster 121 and is also sampled by the input coupler 107. The input signal amplitude adjuster 121 varies the amplitude of the input signal 141 in response to the reference AM signal 143 to impose a reference amplitude modulation on the input signal 14 1. The amplitude modulated input signal is provided to the input signal phase adjuster 123. The input signal phase adjuster 123 varies the phase of the input signal 141 in response to the reference PM signal 145 to impose a reference phase modulation on the input signal 141.

The amplitude-and-phase modulated input signal is applied to an input of the amplifier circuit 101. The amplifier circuit 101 amplifies the modulated input signal, introducing nonlinear distortion (e.g., intermodulation distortion) in the process. The amplified signal 142 is sampled by the amplifier output coupler 109 and the sampled amplified signal is supplied as one input to the combining network 115. The other input to the combining network 115 is the time-delayed sampled input signal. The time delay introduced to the sampled input signal by the delay device 113 is approximately equal to the time delay introduced to the input signal 141 as the input signal 141 propagated through the input signal amplitude adjuster 121, the input signal phase adjuster 123, the amplifier circuit 101, and the amplifier output coupler 109. Time-delaying the sampled input signal insures that substantially time-coincident input signals are provided to the combining network 115. The couplings provided by the input coupler 107 and the amplifier output coupler 109 are selected to provide substantially equal amplitude input signals to the combining network 115.

The combining network 115 subtracts the sampled input signal from the sampled amplified signal to determine the distortion and modulation contained in the sampled amplified signal. This determined modulation is then supplied to the amplitude adjuster 131. Thus, the input coupler 107, the amplifier output coupler 109, and the combining network 115 together comprise a means for determining the reference modulation contained in the output signal 142 of the amplifier circuit 101.

The determined modulation is applied to the amplitude adjuster 131, which varies the amplitude of the determined modulation in response to an amplitude control signal 153 provided by the amplitude reference signal receiver 127. The amplitude-adjusted modulation is applied to the phase adjuster 133, which varies the phase of the determined modulation in response to a phase control signal 155 provided by the phase reference signal receiver 129. The adjusted modulation (amplitude and phase) is provided to the error amplifier 135. The error amplifier 135 amplifies the adjusted modulation, which includes the distortion, and provides the amplified adjusted modulation to the Coupler 137. In a preferred embodiment, a transmission line (not shown) is positioned between the error amplifier 135 and the coupler 137 to invert the amplified adjusted modulation prior to submission to the coupler 137.

The coupler 137 combines the amplified adjusted modulation with the time-delayed amplified signal to effectively subtract the adjusted modulation from the amplified signal 142. The signal resulting from this subtraction is herein referred to as a corrected signal 151. The time delay introduced to the amplified signal 142 by the delay device 111 is approximately equal to the time delay introduced to the sampled amplified signal as the sampled amplified signal propagated through the combining network 115, the amplitude adjuster 131, the phase adjuster 133, the error amplifier 135, and the coupler 137. In this embodiment, the amplitude adjuster 131, the phase adjuster 133, the error amplifier 135, and the transmission line between the error amplifier 135 and coupler 137 together form a means for adjusting the amplitude and phase of the determined modulation. The coupler 137 provides a means for combining the adjusted modulation with the delayed output signal from the amplifier circuit 101, such that the adjusted modulation is subtracted from the delayed output signal to produce the corrected signal 151.

The corrected signal 15 1 is sampled by the feed forward network output coupler 139 and the sampled corrected signal is provided to the input of the amplitude detector 125. The amplitude detector 125 detects (recovers) the amplitude of any residual modulation remaining in the sampled corrected signal. The combined operations of the feed forward network output coupler 139 and the amplitude detector 125 are generally considered a form of demodulation.

Since two modulations (AM and PM) may be present in the sampled corrected signal, the amplitude detector 125 provides the recovered residual modulation to the phase reference signal receiver 129 and the amplitude reference signal receiver 127. If only one reference modulation is present, the recovered residual modulation need only be supplied to the corresponding reference signal receiver 127, 129. The reference signal receivers 127, 129 produce and adjust their respective control signals 153, 155 based on the corresponding amount of recovered residual modulation. Thus, the feed forward network output coupler 139 and the amplitude detector 125 together form a means for recovering residual modulation in the corrected signal 151, while the reference signal receivers 127, 129 constitute means for producing and adjusting the control signals 153, 155 used by the amplitude adjuster 131 and the phase adjuster 133.

In a preferred embodiment, the control signals 153, 155 are adjusted to minimize the amount of recovered residual modulation. Since the modulation determined by the combining network 115, and subsequently adjusted by the amplitude adjuster 13 1, the phase adjuster 133, and the error amplifier 135, includes the distortion produced by the amplifier circuit 101, the net effect of reducing the residual modulation in the corrected signal 151 (i.e., the output signal of the feed forward network 100) is a reduction in the amount of nonlinear distortion in the corrected signal 151. Reduced output signal distortion is a result that all feed forward amplifier network implementations strive to attain. However, in contrast to prior art feed forward methodologies, the present invention eliminates the need to generate and inject an independent RF pilot signal into the input of the amplifier circuit 101 by applying known modulations to the existing RF input signal 141. In the present invention, the modulations are used as the reference media for monitoring and mitigating the distortion in the feed forward network's output signal 151.

Figure 2:
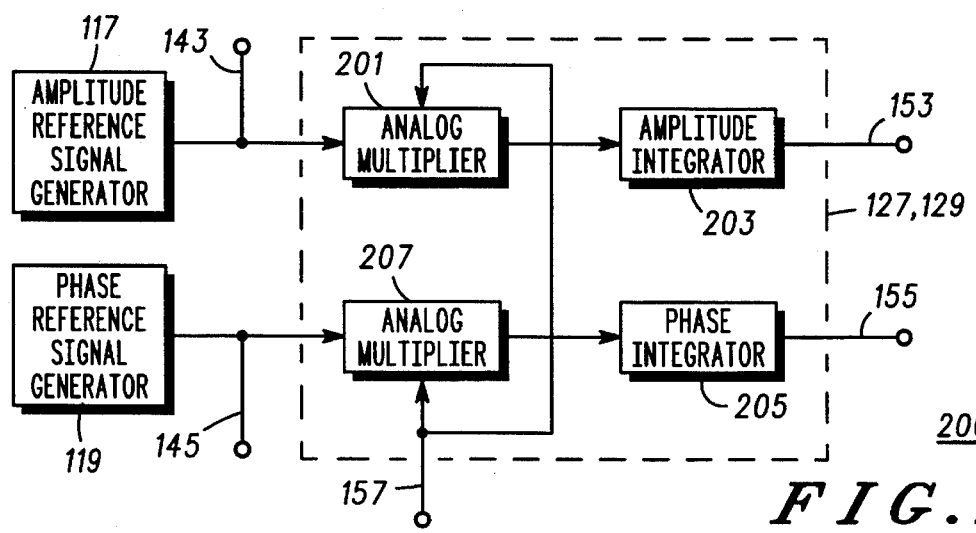
FIG. 2 illustrates a preferred reference signal receiver in accordance with the present invention.

FIG. 2 illustrates a preferred embodiment 200 of the reference signal receivers 127, 129 of FIG. 1. The amplitude reference signal receiver 127 preferably comprises an analog multiplier 201 and an amplitude integrator 203. The phase reference signal receiver 129 preferably comprises an analog multiplier 207 and a phase integrator 205. In the preferred embodiment, the amplitude integrator 203 and the phase integrator 205 each comprise a very narrowband (e.g., 1 Hz) operational amplifier integrator network. High resolution integrators 203, 205 are desirable to minimize small offset errors in the control signals 153, 155.

To produce or adjust the control signals 153,155 provided to the amplitude and phase adjusters 131,133, the analog multipliers 201,207 accept the recovered residual modulation 157 and correlate (e.g., multiply) the recovered residual modulation 157 with the corresponding reference modulation signals 143, 145 produced by the reference signal generators 117, 119 to obtain respective correlation signals. Each correlation signal is then filtered by the appropriate integrator 203, 205 to produce the updated control signal 153, 155. For example, to adjust the amplitude control signal 153, the analog multiplier 201 correlates the reference AM signal 143 with the recovered residual amplitude modulation 157 to obtain an amplitude correlation signal. The amplitude correlation signal is then filtered by the amplitude integrator 203 to produce the updated amplitude control signal 153. In a similar manner to adjust the phase control signal 155, the analog multiplier 207 correlates the reference PM signal 145 with the recovered residual phase modulation 157 to obtain a phase correlation signal. The phase correlation signal is then filtered by the phase integrator 205 to produce the updated phase control signal 155.

Figure 3:
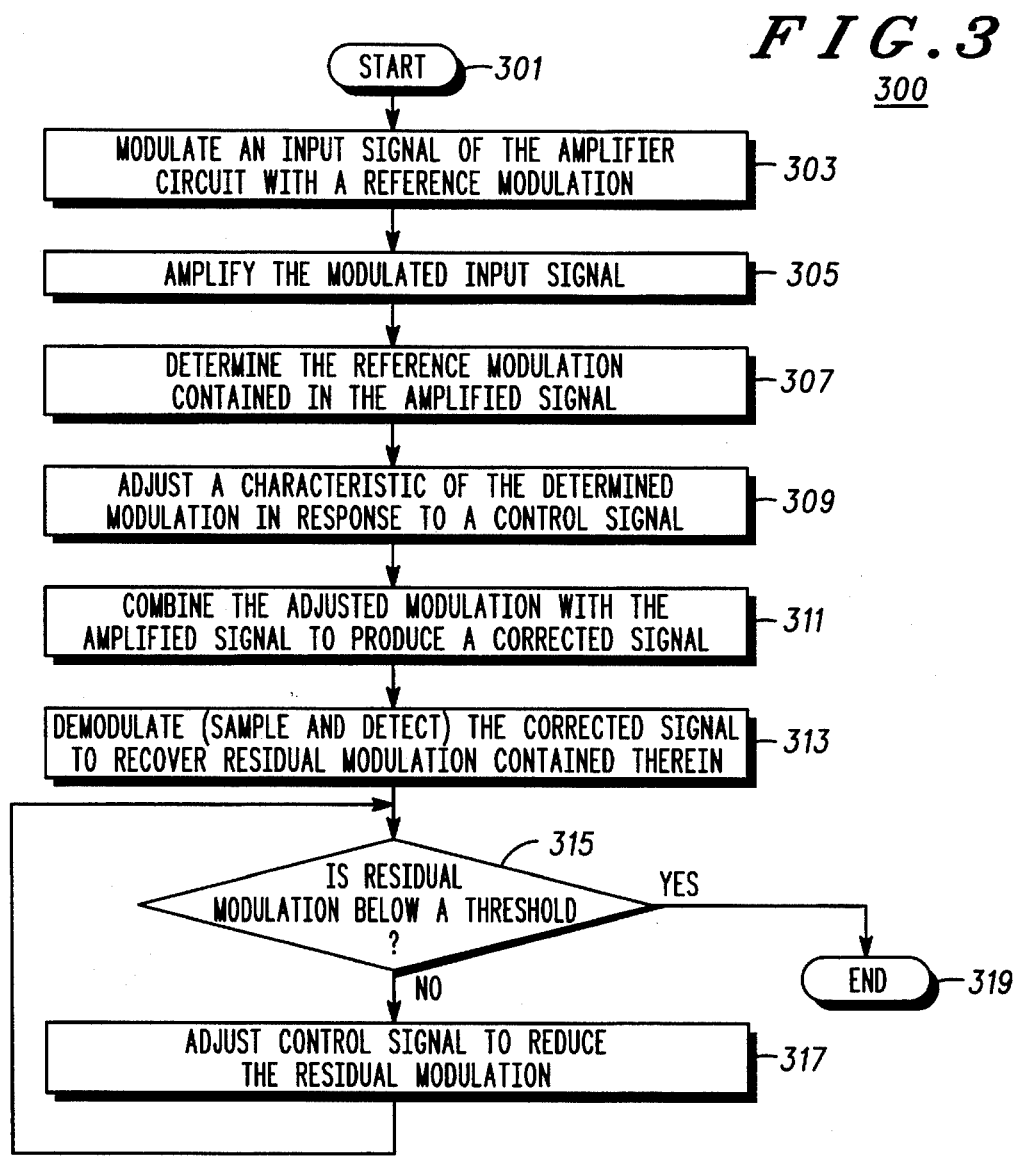
FIG. 3 illustrates a logic flow diagram of steps executed to reduce distortion in an output signal of an amplifier circuit in accordance with the present invention.

FIG. 3 illustrates a logic flow diagram 300 of steps executed to reduce distortion in an output signal of an amplifier circuit in accordance with the present invention.

The logic flow begins (301) when an input signal of the amplifier circuit is modulated (303) with a reference modulation. The reference modulation may be AM, PM, or both and is preferably applied as described above with regard to FIG. 1. The amplifier circuit amplifies (305) the modulated input signal and, due to the inherent nonlinearities present in semiconductor devices, introduces nonlinear distortion during the amplification process.

The reference modulation contained in the amplified signal is then determined (307) by subtracting a sample of the pre-modulated signal from a sample of the amplified signal. A characteristic of this determined modulation (i.e., amplitude, phase, or both) is adjusted (309) in response to a control signal as detailed above with regard to FIG. 1. The adjusted modulation is combined (311 ) with the amplified signal to produce a corrected signal having a lower amount of reference modulation and distortion than the original amplified signal.

The corrected signal is demodulated (i.e., sampled and detected) (313) to recover any residual modulation remaining in the corrected signal. In a preferred embodiment, when the amount of residual modulation exceeds a predetermined threshold (e.g., 60 dB below the RF carrier amplitude) (315), the control signal driving the characteristic adjustment (309) of the determined modulation is adjusted (317) to reduce the residual modulation, and correspondingly the nonlinear distortion, remaining in the corrected signal. Once the residual modulation is below the threshold (315), the logic flow ends (319).

The present invention encompasses a method and apparatus for reducing distortion contained in an output signal of an amplifier circuit. With this invention, RF pilot signals are not necessary to measure the amount of distortion contained in the output signal of a feed forward amplifier network. Accordingly, this invention eliminates the need for the complex, costly RF circuitry associated with the generation and reception of those RF pilot signals. The present invention, on the other hand, utilizes low frequency modulation as the reference signal for distortion detection and reduction. Thus, the present invention permits the use of low cost analog circuitry to generate and detect the reference modulation.

What is claimed is:

1. A method for reducing distortion contained in an output signal of an amplifier circuit, the method comprising the steps of:

a) modulating an input signal of the amplifier circuit with a reference modulation to produce a modulated signal;

b) amplifying the modulated signal to produce an amplified modulated signal;

c) sampling the input signal to produce a sampled input signal;

d) sampling the amplified modulated signal to produce a sampled amplified modulated signal;

e) subtracting at least a portion of the sampled input signal from at least a portion of the sampled amplified modulated signal and using an envelope amplitude detector to determine the reference modulation contained in the amplified modulated signal to produce a determined modulation; and f) using the determined modulation to mitigate the distortion contained in the output signal of the amplifier circuit.

2. The method of claim 1, wherein step (f) comprises the steps of:

f1) adjusting a characteristic of the determined modulation in response to a control signal to produce an adjusted modulation;

f2) combining the adjusted modulation with the amplified modulated signal to produce a corrected signal;

f3) demodulating the corrected signal to recover residual modulation contained therein to produce a recovered residual modulation; and f4) adjusting the control signal based on the recovered residual modulation, such that the residual modulation is reduced in the corrected signal.

3. The method of claim 2, wherein the characteristic of the determined modulation comprises an amplitude.

4. The method of claim 2, wherein the characteristic of the determined modulation comprises a phase.

5. The method of claim 2, wherein step (f3) comprises the steps of:

f3a) sampling the corrected signal to produce a sampled corrected signal; and f3b) detecting the residual modulation in the sampled corrected signal to produce the recovered residual modulation.

6. The method of claim 2, wherein step (f4) comprises the steps of:

f4a) multiplying the reference modulation with the recovered residual modulation to produce a correlation signal; and f4b) filtering the correlation signal to obtain the control signal.

7. The method of claim 1, wherein the reference modulation comprises phase modulation.

8. The method of claim 1, wherein the reference modulation comprises amplitude modulation.

9. The method of claim 1, wherein step (f) further comprises the step of adjusting a characteristic of the determined modulation to produce an adjusted modulation.

10. A method for reducing distortion contained in an output signal of an amplifier circuit, the method comprising the steps of:

a) modulating an input signal of the amplifier circuit with a reference modulation to produce a modulated signal;

b) amplifying the modulated signal to produce an amplified modulated signal;

c) determining the reference modulation contained in the amplified modulated signal to produce a determined modulation;

d) adjusting a characteristic of the determined modulation in response to a control signal to produce an adjusted modulation;

e) combining the adjusted modulation with the amplified modulated signal to produce a corrected signal;

f) demodulating the corrected signal to recover residual modulation contained therein to produce recovered residual modulation; and g) adjusting the control signal based on the recovered residual modulation, such that the residual modulation is reduced in the corrected signal.

11. The method of claim 10, wherein the characteristic of the determined modulation comprises an amplitude.

12. The method of claim 10, wherein the characteristic of the determined modulation comprises a phase.

13. The method of claim 10, wherein step (g) comprises the steps of:

g1) multiplying the reference modulation with the recovered residual modulation to produce a correlation signal; and g2) filtering the correlation signal to obtain the control signal.

14. A feed forward amplifier network comprising:

an amplifier circuit having an input responsive to an input signal and an output producing an output signal;

a first coupler sampling the input signal to produce a sampled input signal;

a second coupler sampling the output signal to produce a sampled output signal;

a modulation device coupled to the input of the amplifier circuit, said modulation device modulating the input signal with a reference modulation;

a combination circuit responsive to the sampled output signal, and the sampled input signal and producing a determined modulation by subtracting the sampled input signal from the sampled output signal;

means for reducing distortion contained in the output signal of the amplifier circuit based on the determined modulation; and an envelope detector responsive to the output signal.

15. The feed forward amplifier network of claim 14, wherein the means for reducing comprises:

means, operably coupled to the combination circuit, for adjusting a characteristic of the determined modulation in response to a control signal to produce an adjusted modulation;

means, operably coupled to the output of the amplifier circuit and the means for adjusting a characteristic of the determined modulation, for combining the adjusted modulation with the output signal of the amplifier circuit to produce a corrected signal;

means, operably coupled to the output of the amplifier circuit and the means for adjusting a characteristic of the determined modulation, for recovering residual modulation contained in the corrected signal to produce a recovered residual modulation; and means, coupled to the means for recovering and the means for adjusting a characteristic of the determined modulation, for adjusting the control signal based on the recovered residual modulation.

16. The feed forward amplifier network of claim 15, wherein the means for adjusting a characteristic of the determined modulation comprises:

a characteristic adjuster; and a second amplifier circuit, coupled to an output of the characteristic adjuster.

17. The feed forward amplifier network of claim 16, wherein the characteristic adjuster comprises a phase adjuster.

18. The feed forward amplifier network of claim 16, wherein the characteristic adjuster comprises an amplitude adjuster.

19. The feed forward amplifier network of claim 15, further comprising:

a coupler that samples the corrected signal to produce a sampled corrected signal; and an amplitude detector, coupled to the coupler, that extracts an amplitude of the residual modulation from the sampled corrected signal to produce the recovered residual modulation.

20. The feed forward amplifier network of claim 19, wherein the modulation device comprises:

a reference signal generator that generates a reference signal; and a characteristic adjuster, coupled to the reference signal generator, that modulates the input signal in response to the reference signal.

21. The feed forward amplifier network of claim 20, wherein the means for adjusting the control signal comprises a reference signal receiver, coupled to an output of the amplitude detector.

22. The feed forward amplifier network of claim 21, wherein the reference signal receiver comprises:

an analog multiplier that multiplies the reference modulation with the recovered residual modulation to produce a correlation signal; and an integrator, coupled to the analog multiplier, that filters the correlation signal to produce the control signal.

23. The feed forward amplifier network of claim 14, wherein the modulation device comprises an amplitude modulator.

24. The feed forward amplifier network of claim 14, wherein the modulation device comprises a phase modulator.

25. The feed forward amplifier network of claim 14, wherein the combination circuit comprises:

a combining network, operably coupled to the first coupler and the second coupler.

26. A feed forward amplifier network comprising:

an amplifier circuit;

a modulator, coupled to an input of the amplifier circuit, that modulates an input signal of the amplifier circuit with a reference modulation;

a modulation determination circuit, coupled to an output of the amplifier circuit, that determines the reference modulation contained in an output signal of the amplifier circuit to produce a determined modulation;

an adjustment circuit, coupled to the modulation determination circuit and the output of the amplifier circuit, that adjusts a characteristic of the determined modulation in response to a control signal to produce an adjusted modulation, and combines the adjusted modulation with the output signal of the amplifier circuit to produce a corrected signal; and a residual modulation detection circuit, coupled to the output of the amplifier circuit and the adjustment circuit, that recovers residual modulation contained in the corrected signal and produces the control signal based on the residual modulation.

27. A feed forward amplifier network comprising:

an amplifier circuit;

a reference signal generator that generates a reference signal;

an input signal characteristic adjuster, coupled to the reference signal generator and an input of the amplifier circuit, that modulates an input signal of the amplifier circuit with a reference modulation based on the reference signal;

a modulation determination circuit, coupled to an output of the amplifier circuit, that determines the reference modulation contained in an output signal of the amplifier circuit to produce a determined modulation;

an adjustment circuit, coupled to the modulation determination circuit and the output of the amplifier circuit, that adjusts a characteristic of the determined modulation in response to a control signal to produce an adjusted modulation;

a first coupler, coupled to an output of the adjustment circuit and the output of the amplifier circuit, that combines the adjusted modulation with the output signal of the amplifier circuit to produce a corrected signal;

a second coupler, coupled to the output of the amplifier circuit, that samples the corrected signal to produce a sampled corrected signal;

an amplitude detector, coupled to the second coupler, that detects an amplitude of residual modulation contained in the sampled corrected signal to produce a recovered residual modulation; and a reference signal receiver, coupled to an output of the amplitude detector and the adjustment circuit, that produces the control signal based on the recovered residual modulation.

\* \* \* \* \*